United States Patent [19]

Vig et al.

[11] 4,451,755

[45] May 29, 1984

[54] ACCELERATION SENSITIVITY REDUCTION METHOD

[75] Inventors: John R. Vig, Colts Neck; Raymond L. Filler, Freehold, both of N.J.

[73] Assignee: The United States of America as represented by the Secretary of the Army, Washington, D.C.

[21] Appl. No.: 434,998

[22] Filed: Oct. 18, 1982

[51] Int. Cl.³ ........................................... H01L 41/08
[52] U.S. Cl. ................................... 310/361; 310/312
[58] Field of Search ............... 310/311, 312, 361, 367, 310/369

[56] References Cited

U.S. PATENT DOCUMENTS

| | | | |
|---|---|---|---|
| 2,486,916 | 11/1949 | Bottom | 310/369 |
| 3,176,168 | 3/1965 | Barrett | 310/369 X |
| 4,375,604 | 3/1983 | Vig | 310/312 |
| 4,381,471 | 4/1983 | Filler et al. | 310/312 X |

*Primary Examiner*—Mark O. Budd
*Attorney, Agent, or Firm*—Anthony T. Lane; Jeremiah G. Murray; Roy E. Gordon

[57] ABSTRACT

The acceleration sensitivity of an AT-cut quartz crystal plate resonator is reduced by replacing the quartz crystal plate of the resonator with a quartz crystal plate having a flatter plate contour.

3 Claims, No Drawings such ceramic flatpack enclosed resonators have been reported previously. The ceramic flatpack enclosures are available in two sizes. The larger of the two is used to house the 5 MHz and 10 MHz resonators. The smaller package is used for the 20 MHz fundamental mode devices.

The 5 MHz and 10 MHz quartz plates are 14 mm diameter, and are bonded to four 1.5 mm wide molybdenum ribbon "L" clips with silver filled polyimide adhesive. Two clip heights, 0.7 mm and 1.1 mm, and two clip thicknesses, 25 $\mu$m and 18 $\mu$m are used. The clips are spaced 90 degrees apart on the perimeter of the plates, two on the XX' axis and two on the ZZ' axis.

The 20 MHz quartz blanks are 6.4 mm diameter. The dimensions of the clips are 0.75 mm wide 0.7 mm high ×25 $\mu$m thick. The clips are spaced 90 degrees apart, 45 degrees from the ZZ' axis.

The acceleration sensitivity is measured in the following manner:

The resonators are connected to appropriate oscillator circuits and the acceleration sensitivities are determined from the response of the oscillators to sinusoidal vibration. The use of this technique minimizes temperature stability requirements and allows a search for mechanical resonances in the resonator mounting structure. The oscillators are potted in beeswax to eliminate contributions to the acceleration sensitivity from relative motions of oscillator components. The sidebands which appear are caused by frequency modulation of the resonator operating frequency (known as the carrier). The relative magnitude of the power in the first sideband to the power in the carrier is denoted by $\zeta$, $\zeta$ is related to the acceleration senstivity, $\gamma$, of the resonator by $$\gamma = \frac{2f_v}{aF_o} \cdot 10^{\zeta/20}$$

where $f_v$ = vibration frequency in Hz
$F_o$ = resonator operating frequency in Hz
$a$ = acceleration level in g's
$\zeta$ = sideband/carrier ratio in decibels The value of $\gamma$ is determined for several vibration frequencies in order to be certain that mechanical resonances in the oscillator or resonator are absent.

The acceleration sensitivity has been shown to have the properties of a vector, i.e., it has magnitude and direction. The magnitude is obtained by measuring the acceleration sensitivity in three mutually perpendicular directions and taking the square root of the sum of the squares of the three measured values. The units are fractional frequency deviation per g, where g is the magnitude of the earth's gravitational acceleration at sea level.

We wish it to be understood that we do not desire to be limited to the exact details of construction as described for obvious modifications will occur to a person skilled in the art.

What is claimed is:

1. Method of reducing the average acceleration sensitivity of a 10 megahertz, third-overtone AT-cut quartz crystal plate resonator from $3.5 \times 10^{-9}$/g to $7 \times 10^{-10}$/g comprising replacing a 2 diopter contour plano-convex quartz crystal plate with an 0.62 diopter contour plano-convex quartz crystal plate.

2. Method of reducing the acceleration sensitivity of a 5 megahertz third-overtone AT-cut quartz crystal plate resonator from $2.4 \times 10^{-9}$/g to $4.2 \times 10^{-10}$/g comprising replacing a 6 diopter plano-convex quartz crystal plate with a 2 diopter biconvex quartz crystal plate.

3. Method of reducing the acceleration sensitivity of a 5 megahertz fundamental mode AT-cut quartz crystal plate resonator from in excess of $1 \times 10^{-8}$/g to $1 \times 10^{-9}$/g comprising replacing a 2.87 diopter plano convex quartz crystal plate with a 1.37 diopter plano-convex quartz crystal plate.

* * * * *

ACCELERATION SENSITIVITY REDUCTION METHOD

The invention described herein may be manufactured, used and licensed by or for the Government for governmental purposes without the payment to us of any royalty thereon.

This invention relates in general to a method of reducing the acceleration sensitivity of quartz crystal resonators and in particular, to a method of reducing the acceleration sensitivity of AT-cut quartz crystal resonators.

BACKGROUND OF THE INVENTION

There has been considerable interest in recent years in the acceleration sensitivity of frequency standards. The state of the art is such that currently available devices cannot provide the degree of spectral purity required by some modern communications, navigation and radar systems. Some precision timing applications also require immunity from the frequency offset effects of acceleration.

The foregoing requirements have resulted in a great deal of effort being expended in an attempt to reduce the acceleration-sensitivity of quartz crystal resonators.

SUMMARY OF THE INVENTION

The general object of the invention is to provide a method of reducing the acceleration sensitivity of quartz crystal resonators. A more particular object of the invention is to provide a method of reducing the acceleration sensitivity of an At-cut quartz crystal resonator.

It has now been found that the foregoing objects can be attained by replacing the AT-cut quartz crystal plate of the resonator with an AT-cut quartz crystal plate having a flatter plate contour. This is, applicants have found that as the quartz crystal plate contour becomes flatter, the acceleration sensitivity coefficient decreases approximately linearly with diopter value.

Of course, it is well known in the art that at low diameter to thickness ratios, one must use contoured crystal plates in order for the resonator to exhibit high quality factor, Q. Therefore, the inventive concept herein involves replacing the resonator plate with a plate having the flatter contour while still retaining a sufficient contour for the resonator to have an acceptable Q.

DESCRIPTION OF THE PREFERRED EMBODIMENT

EXAMPLE I 10 megahertz, third overtone AT-cut resonators when plano-convex with a 2 diopter contour have an average magnitude of acceleration sensitivity of $3.5 \times 10^{-9}$/g. When the quartz crystal plate is replaced by a similar AT-cut quartz crystal plate except that the convex face has a contour of 0.62 diopter, the resonator has an average acceleration sensitivity of $7 \times 10^{-10}$/g. The accleration sensitivity coefficient for intermediate values of contour vary approximately linearly with increasing diopter value.

EXAMPLE 2

5 megahertz, third overtone AT-cut resonators when plano-convex with a contour of 6 diopters, have an acceleration sensitivity of $2.4 \times 10^{-9}$/g. When the quartz crystal plate is replaced by a similar AT-cut quartz crystal plate made with a bi-convex geometry and with a 2 diopter contour on each face, the acceleration sensitivity is reduced to $4.2 \times 10^{-10}$/g. Although the 2 diopter units are bi-convex, the intermediate values of contour and similar data for the 10 megahertz units suggest that the curvature of the contoured face is more important than the bi-convex geometry.

EXAMPLE 3

5 megahertz, fundamental mode AT-cut resonators when plano-convex with a contour of 2.87 diopter have an acceleration sensitivity coefficient in excess of $1 \times 10^{-8}$/g. When the quartz crystal plate is replaced by a similar AT-cut quartz crystal plate except that the convex faces have a contour of 1.37 diopter, the resonator has an average acceleration sensitivity of $1 \times 10^{-9}$/g.

The method of the invention is particularly applicable to the AT-cut quartz crystal plate resonator. For example, there has not been any relationship observed between blank contour and acceleration sensitivity for SC-cut resonators.

EXAMPLE 4

In most instances, it may not be desirable to replace the AT-cut quartz crystal plate with a plate having the flattest contour. Suppose, for example, there is a need for a 10 megahertz acceleration resistant resonator for a voltage controlled crystal oscillator, i.e., VCXO. It is determined in such a case that the resonator must be either a third overtone or a fundamental mode resonator. It is then further determined that an AT-cut third overtone resonator is preferred due to its higher realizable quality factor, Q its lower motional capacitance, C and lower aging characteristics. To satisfy the requirement, resonators are prepared from AT-cut 14 mm diameter crystals of plano-convex geometry and contours ranging from 0.12 diopter to 3.0 diopter. The resonator with a contour of 3.0 diopter has an acceleration sensitivity of $4 \times 10^{-9}$/g which is too high. It is then found that the acceleration sensitivity decreases approximately linearly with the diopter value of crystal plate contour. However, it is also found that at the very lowest diopters of 0.12 and 0.25 diopter, the Q's are significantly lower than for the rest of the resonators. It is also found that the resonators made with the 0.5 diopter contour have very low acceleration sensitivity on the order of 3 to $5 \times 10^{-10}$/g while also having excellent Q's in excess of 1,000,000. The 3.0 diopter crystal is then replaced with the 0.5 diopter crystal as the 0.5 diopter crystal has the optimum design for meeting the particular requirements.

The experiments as embodied in Examples 1 to 4 are performed on resonators mounted on a four point mounting structure; i.e., the resonators blanks are mounted on four mounting clips, as opposed to the conventionally used two or three point mounting structure. Although flatter plate contours result in lower acceleration sensitivity in two and three point mounted resonators also, it has been found that the flatter plate contours, when used with a four point mounting structure, result in substantially lower acceleration sensitivity than when the same plate is used in a two or three point mounting structure.

The four point mounting structures of examples 1 to 4 are parts of flatpacks. The details of the fabrication of